US011402758B2

(12) United States Patent
Tanaka

(10) Patent No.: US 11,402,758 B2
(45) Date of Patent: Aug. 2, 2022

(54) SUBSTRATE PROCESSING APPARATUS, SUBSTRATE PROCESSING METHOD, AND STORAGE MEDIUM

(71) Applicant: TOKYO ELECTRON LIMITED, Tokyo (JP)

(72) Inventor: Keiichi Tanaka, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/008,847

(22) Filed: Sep. 1, 2020

(65) Prior Publication Data

US 2021/0063882 A1 Mar. 4, 2021

(30) Foreign Application Priority Data

Sep. 3, 2019 (JP) .............................. JP2019-160274

(51) Int. Cl.
*G03F 7/20* (2006.01)
(52) U.S. Cl.
CPC .......... *G03F 7/2004* (2013.01); *G03F 7/2041* (2013.01); *G03F 7/70625* (2013.01); *G03F 7/70016* (2013.01)
(58) Field of Classification Search
CPC ............... G03F 7/72004; G03F 7/7041; G03F 7/70625; G03F 7/2004

USPC ...................................................... 430/270.1
See application file for complete search history.

(56) References Cited

U.S. PATENT DOCUMENTS

2018/0184508 A1* 6/2018 Tanaka ..................... H05F 3/04

FOREIGN PATENT DOCUMENTS

JP 3342856 B2 8/2002

\* cited by examiner

*Primary Examiner* — Hung V Nguyen
(74) *Attorney, Agent, or Firm* — Nath, Goldberg & Meyer; Jerald L. Meyer; Tanya E. Harkins

(57) ABSTRACT

There is provided a substrate processing apparatus including: a holder configured to hold a substrate having a pattern formed with a resist material for ArF immersion lithography on a surface of the substrate inside a processing container; a rotation driver configured to rotate the holder; and a light source part having a plurality of light sources configured to irradiate the surface of the substrate held by the holder which is rotated by the rotation driver wherein the light sources include irradiating vacuum ultraviolet light, wherein an amount of irradiation of an inner side of the substrate with light from the light source part is made larger than an amount of irradiation of an outer side of the substrate with light from the light source part.

9 Claims, 15 Drawing Sheets

SUBSTRATE PROCESSING APPARATUS, SUBSTRATE PROCESSING METHOD, AND STORAGE MEDIUM

CROSS-REFERENCE TO RELATED APPLICATION

This application is based upon and claims the benefit of priority from Japanese Patent Application No. 2019-160274, filed on Sep. 3, 2019, the entire contents of which are incorporated herein by reference.

TECHNICAL FIELD

The present disclosure relates to a substrate processing apparatus, a substrate processing method, and a non-transitory computer-readable storage medium.

BACKGROUND

Patent Document 1 discloses that in a process of manufacturing a semiconductor device, a process of irradiating with light having a wavelength of 200 nm or less the front surface of a resist film formed on the surface of a substrate and patterned after exposure, and a process of etching an underlying film of the resist film, which are sequentially performed. The process of irradiating with light having a wavelength of 200 nm or less (hereinafter, simply referred to as a light irradiation process) is performed for the purpose of improving the roughness (irregularities) of the resist film, for example.

PRIOR ART DOCUMENTS

Patent Documents

Patent Document 1: Japanese Patent No. 3342856

SUMMARY

According to one embodiment of the present disclosure, there is provided a substrate processing apparatus including: a holder configured to hold a substrate having a pattern formed with a resist material for ArF immersion lithography on a surface of the substrate inside a processing container: a rotation driver configured to rotate the holder: and a light source part having a plurality of light sources configured to irradiate the surface of the substrate held by the holder which is rotated by the rotation driver wherein the light sources include irradiating vacuum ultraviolet light, wherein an amount of irradiation of an inner side of the substrate with light from the light source part is made larger than an amount of irradiation of an outer side of the substrate with light from the light source part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
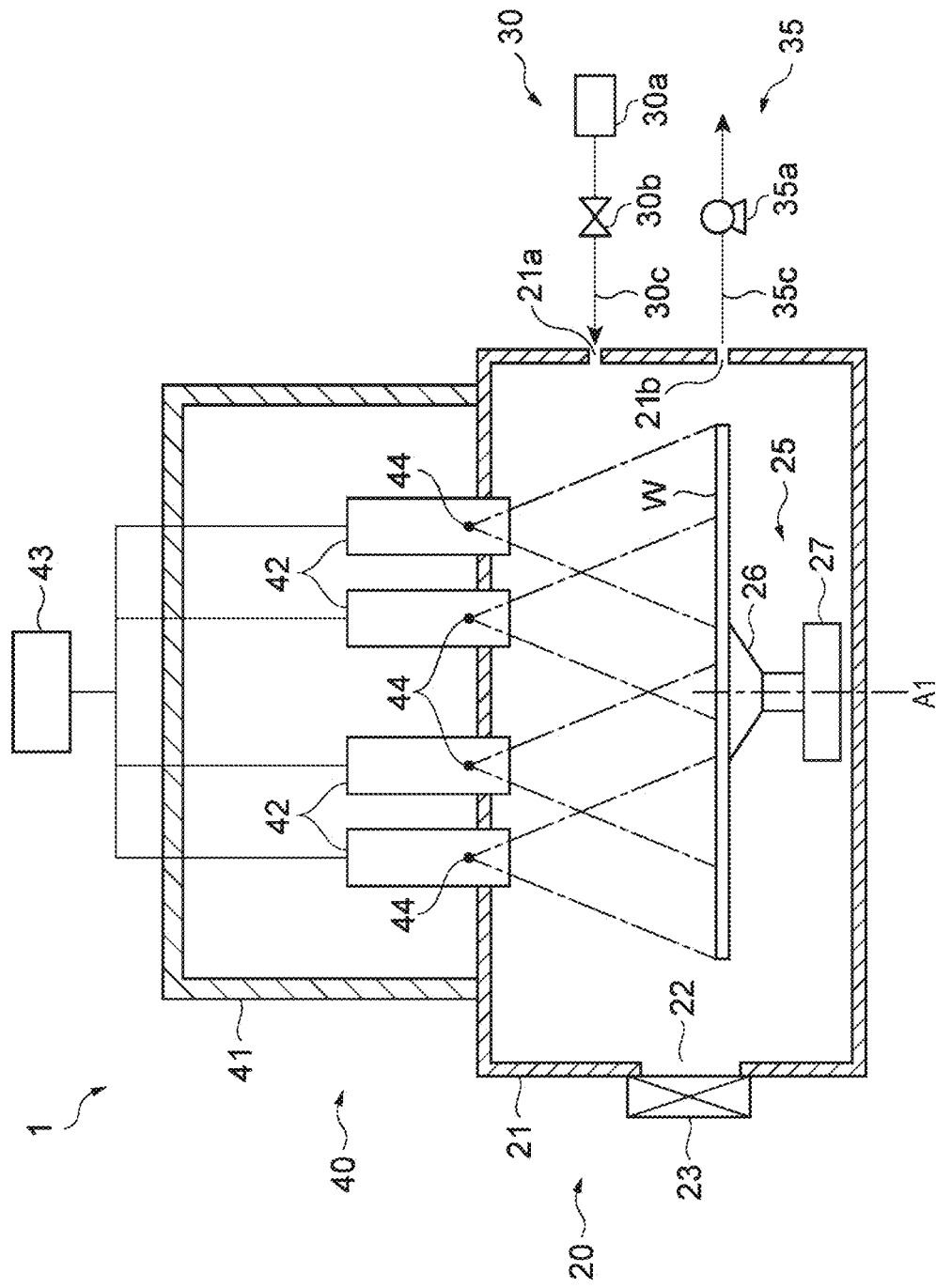
FIG. 1 is a view illustrating a substrate processing apparatus according to an exemplary embodiment.

Hereinafter, various exemplary embodiments will be described. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In one exemplary embodiment, a substrate processing apparatus includes: a holder configured to hold a substrate having a pattern formed with a resist material for ArF immersion lithography on a surface of the substrate inside a processing container; a rotation driver configured to rotate the holder; and a light source part having a plurality of light sources configured to irradiate the surface of the substrate held by the holder rotated by the rotation driver with light including vacuum ultraviolet light, wherein an amount of irradiation of an inner side of the substrate with light from the light source part is made larger than an amount of irradiation of an outer side of the substrate with light from the light source part.

In the substrate having the pattern formed with the resist material for ArF immersion lithography on the surface of the substrate, the degree of improvement in the surface roughness of the pattern tends to change depending on the irradiation amount of light. Further, when the substrate is irradiated with light while rotating the substrate, it can be considered that the moving speed of the substrate becomes slower on the inner side, and thus the irradiation amount of light becomes smaller. On the other hand, according to the above substrate processing apparatus, the amount of irradiation of the inner side of the substrate with light can be made larger than the amount of irradiation of the outer side of the substrate with light. Therefore, it is possible to increase the amount of irradiation of the inner side of the substrate with light, thus enhancing the effect of improving the surface roughness.

In one embodiment, an output intensity of an inner light source of the plurality of light sources, which irradiates the inner side of the substrate with light, may be made higher than an output intensity of an outer light source of the plurality of light sources, which irradiates the outer side of the substrate with light.

As described above, by increasing the output intensity of the inner light source so that the amount of irradiation of the inner side of the substrate with light is larger than the amount of irradiation of the outer side of the substrate with light, the irradiation amount of light between the inner side and the outer side of the substrate may be adjusted more easily.

In one embodiment, a time of irradiation of the inner side of the substrate with light may be different from a time of irradiation of the outer side of the substrate with light.

As described above, by making the irradiation time of light different between the inner side and the outer side of the substrate so that the amount of irradiation of the inner side of the substrate with light is larger than the amount of irradiation of the outer side of the substrate with light, the irradiation amount of light between the inner side and the outer side of the substrate may be adjusted more easily.

In one embodiment, the substrate processing apparatus may further include a gas supply part configured to supply an inert gas into the processing container, and a gas discharge part configured to discharge a gas from the processing container, wherein the gas supply part may supply the gas and the gas discharge part may discharge the gas, while changing an internal pressure of the processing container during the irradiation with light by the light source part.

As described above, by supplying and discharging the gas while changing the internal pressure of the processing container during the irradiation with light by the light source part, it is possible to irradiate the pattern with the vacuum ultraviolet light while keeping the internal pressure of the processing container in a state according to the surface conditions of the substrate.

In one exemplary embodiment, a substrate processing method irradiates a surface of a substrate having a pattern formed with a resist material for ArF immersion lithography on the surface of the substrate inside a processing container with light including vacuum ultraviolet light from a light source part having a plurality of light sources while rotating the substrate. The method includes making an amount of irradiation of an inner side of the substrate with light from the light source part larger than an amount of irradiation of an outer side of the substrate with light from the light source part.

According to the above substrate processing method, it is possible to make the amount of irradiation of the inner side of the substrate with light larger than the amount of irradiation of the outer side of the substrate with light, thus increasing the amount of irradiation of the inner side of the substrate with light and enhancing the effect of improving the surface roughness.

In another exemplary embodiment, a non-transitory computer-readable storage medium may store a program that causes an apparatus to perform the aforementioned substrate processing method Hereinafter, various exemplary embodiments will be described in detail with reference to the figures. Throughout the drawings, the same or corresponding parts will be denoted by the same reference numerals.

[Configuration of Substrate Processing Apparatus]

FIG. 1 is a schematic view (longitudinal sectional side view) illustrating a substrate processing apparatus according to an embodiment. The substrate processing apparatus 1 illustrated in FIG. 1 irradiates a wafer W (substrate) with light for processing. For example, the substrate processing apparatus 1 is configured to irradiate a resist film or resist pattern formed on a surface of the wafer W with vacuum ultraviolet light (VUV), thus improving a surface roughness of these resist materials.

The wafer W has a disk shape. In the wafer W, a portion of a circle may be cut out. A wafer having a shape other than the circular shape, such as a polygon, may be used as the wafer W. The wafer W may be, for example, a semiconductor substrate, a glass substrate, a mask substrate, an FPD (Flat Panel Display) substrate, or other various substrates.

Figure 2A:
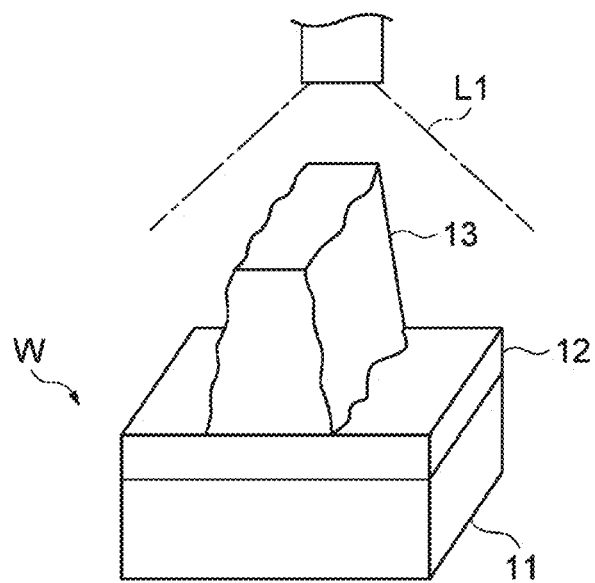
FIGS. 2A and 2B are schematic views illustrating a processing of a substrate by the substrate processing apparatus.
Figure 2B:
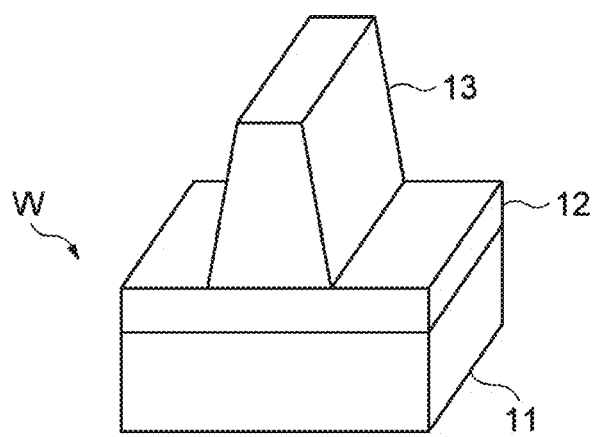

FIGS. 2A and 2B show an example of a process for the wafer W by the substrate processing apparatus 1. As shown in FIG. 2A, in the wafer W, a resist pattern 13 is formed on an SOC film 11 (Silicon-on-Carbon) which is an underlying film, and an SOG film 12 (Silicon-on-Glass) on the SOC film 11. In the substrate processing apparatus 1, as shown in FIG. 2B, the roughness of the surface of the resist pattern 13 is improved by irradiating the surface of the wafer W with light L1 for processing. The resist pattern 13 is a mask pattern for etching the SOC film 11 and the SOG film 12, which are underlying films, to form a pattern on these underlying films.

Returning to FIG. 1, each part of the substrate processing apparatus 1 will be described. As illustrated in FIG. 1, the substrate processing apparatus 1 includes a processing container 20, a light irradiation mechanism 40, and a controller 100 (control part). In FIG. 1, only a portion of the configuration included in the light irradiation mechanism 40 is shown.

The processing container 20 includes a housing 21, a transfer port 22, a rotation support part 25, a gas supply part 30, and a gas discharge part 35. The housing 21 is, for example, a portion of a vacuum container provided in air atmosphere, and is configured to be able to accommodate the wafer W transferred by a transfer mechanism (not shown). In the substrate processing apparatus 1, the wafer W is processed while the wafer W is accommodated in the housing 21. The transfer port 22 is formed in aside wall of the housing 21. The transfer port 22 is an opening through which the wafer W is loaded into and unloaded from the housing 21. The transfer port 22 is opened and closed by a gate valve 23.

The rotation support part 25 has a function of holding the wafer W while rotating the wafer W inside the housing 21 based on an instruction from the controller 100. The rotation support part 25 has, for example, a holder 26 and a rotation driver 27. The holder 26 supports the central portion of the wafer W horizontally arranged with the surface on which the resist pattern 13 is formed oriented upward, and holds the wafer W by, for example, vacuum suction. The rotation driver 27 has a function of rotating the holder 26 holding the wafer W together with the wafer W around a vertical axial line A1. The rotation driver 27 is, for example, a rotation actuator that uses an electric motor as a power source.

The gas supply part 30 is configured to supply an inert gas (for example, argon, nitrogen, etc.) into the housing 21 via a through-hole 21a formed in the housing 21. The gas supply part 30 has a gas source 30a, a valve 30b, and a pipe 30c. The gas source 30a stores the inert gas to function as a source of the inert gas. The valve 30b operates based on an operation signal from the controller 100 to open/close the pipe 30c. The pipe 30c connects the gas source 30a, the valve 30b, and the through-hole 21a sequentially from the upstream side.

The gas discharge part 35 discharges a gas from the housing 21 via a through-hole 21b formed in the housing 21. The gas discharge part 35 includes a vacuum pump 35a and a pipe 35c. The vacuum pump 35a discharges a gas from the interior of the housing 21. The pipe 35c connects the through-hole 21b and the vacuum pump 35a.

Figure 3:
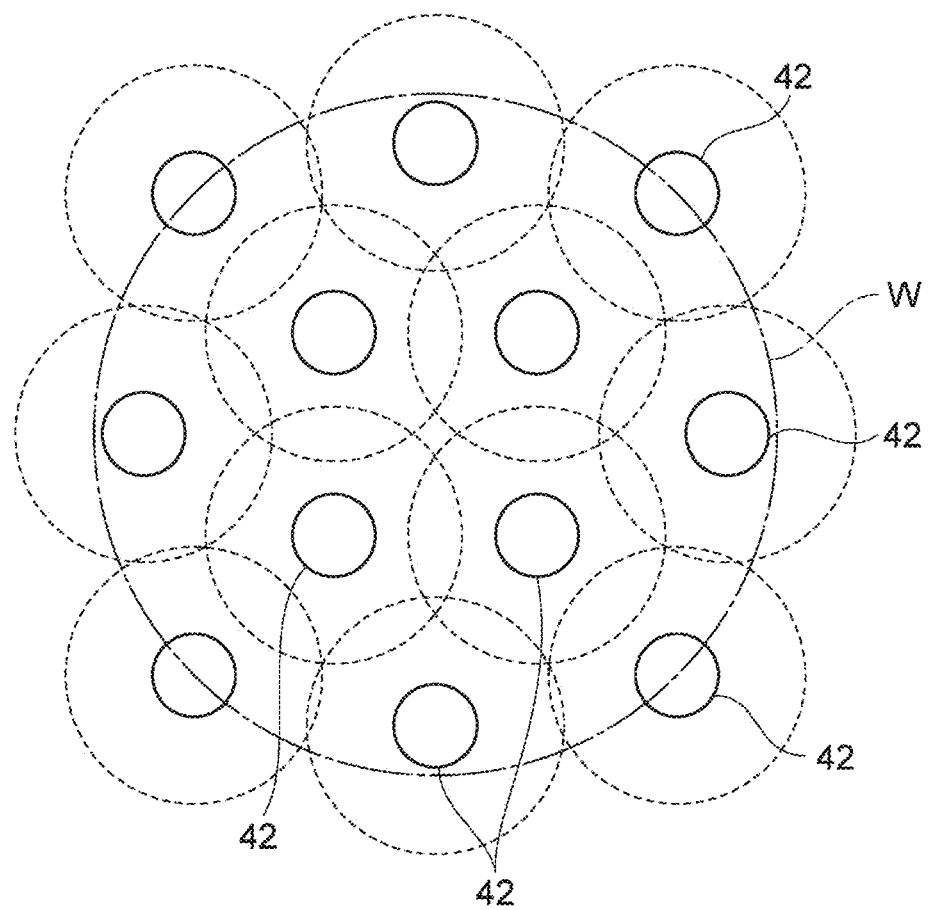
FIG. 3 is a schematic view illustrating an arrangement of light sources in the substrate processing apparatus.

The light irradiation mechanism 40 includes a housing 41, light sources 42, and a switch 43. The housing 41 is provided above the housing 21. A plurality of light sources 42 are accommodated in the housing 41. FIG. 3 is a plan view showing an example of an arrangement of the light sources 42. The light sources 42 are arranged along two concentric circles centered at the axial line A1 that is a rotational axis of the holder 26 when viewed in a plane. Specifically, four light sources 42 are arranged along an inner circle and eight light sources 42 are arranged along an outer circle at circumferential intervals. Further, the light sources 42 thus arranged irradiates with light the entire surface of the wafer W held by the holder 26. The switch 43 switches ON/OFF of lighting of the light sources 42. The operation of the switch 43 is controlled by the controller 100. The arrangement of the light sources 42 is an example, and may be changed as appropriate.

Each of the light sources 42 emits light having a wavelength of 115 nm to 400 nm, that is, light having a continuous spectrum of 115 nm to 400 nm. The light forming a continuous spectrum in this range includes light having a wavelength of 10 nm to 200 nm (that is, VUV light) and may also include near-ultraviolet light (near-ultraviolet ray) having a wavelength larger than that of the VUV light. The light from the light source 42 may be configured to include light in the wavelength band of 160 nm or less. The light source 42 is, for example, a deuterium lamp, and may be configured to emit VUV light having a wavelength of 200 nm or less. The wavelength of the peak of the continuous spectrum may be, for example, 160 nm or less, or 150 nm or more.

Since the wavelength range of the spectrum of the light emitted from the light source 42 is relatively wide, the resist pattern 13 on the wafer W may receive energy of light having various wavelengths. As a result, various reactions occur on the surface of the resist pattern 13. Specifically, chemical bonds at various positions in the molecules constituting the resist pattern 13 are cleaved to generate various compounds, so that the orientation of the molecules existing in the resist film before light irradiation is eliminated. As a result, the surface free energy in the resist pattern 13 is reduced and the internal stress thereof is reduced. That is, by using the light source 42 as a light source, the fluidity of the surface of the resist pattern 13 tends to be high. This enhances the effect of improving the roughness of the surface.

Further, in the resist pattern 13, a crosslinking reaction also occurs during and after irradiation with the light (especially, VUV light) from the light source 42. Since the crosslinking reaction occurs simultaneously in the resist pattern 13, the surface of the resist pattern 13 is hardened, and as a result, the etching resistance thereof becomes high. Therefore, when the underlying film is etched using the resist pattern 13 as a mask, the roughness of the surface of the pattern in the underlying film can be improved.

Among the light emitted from the light source 42, a component of light having a wavelength shorter than 160 nm is considered to greatly contribute to the improvement of the roughness of the surface of the resist pattern 13 and the pattern of the underlying film. For example, it has been confirmed that when the resist pattern is irradiated with only light having a wavelength longer than 160 nm, the roughness of the surface is not sufficiently improved, and only chemical bonds are broken. However, even when only light having a wavelength shorter than 160 nm is irradiated, the roughness of the surface is not sufficiently improved. Therefore, it is considered that a continuous spectrum of light including both light having a wavelength longer than 160 nm and light having a wavelength shorter than 160 nm, such as a deuterium lamp, is important for improving the surface roughness.

Further, as for the light from the light source 42 with which the resist pattern 13 is irradiated, light having a larger wavelength can reach a deeper layer of the resist pattern 13 when the intensity thereof is larger. However, since the wavelength of the peak of the spectrum of the light emitted from the light source 42 is included in the band of the VUV light (10 nm to 200 nm) as described above, regarding the light emitted from the light source 42, the intensity of light having a relatively large wavelength is small. Therefore, few of the light emitted from the light source 42 reaches the deep layer of the resist film, and the breaking of the above-mentioned bonds of molecules can be suppressed in the deep layer of the resist film. That is, by using the light source 42, the region of the resist pattern 13 that reacts by light irradiation can be limited to the surface.

Regarding light in the VUV band as well, the reach depth in the resist pattern changes depending on the wavelength. That is, as described above, a light component having a longer wavelength than the light having a wavelength of 150 nm to 160 nm near at which the light intensity becomes maximum can reach the deep layer (for example, 150 nm or more) of the resist pattern 13. On the other hand, a light component having a wavelength smaller than 150 nm reaches only the vicinity of the surface of the resist pattern 13 (for example, 50 nm or less). Further, it is known that the intensity of a component having a wavelength smaller than 150 nm is smaller than that of the wavelength band of the peak in VUV light. That is, a light component having a wavelength shorter than 160 nm, which contributes to the improvement of the roughness of the surface, reaches only the vicinity of the surface of the resist pattern 13 (does not reach the deep layer) and promotes hardening of the surface of the resist pattern 13 due to the crosslinking reaction in the vicinity of the surface. In this way, the light component having a wavelength shorter than 160 nm is considered to be important for promoting the crosslinking reaction in the vicinity of the surface of the resist pattern 13. Thus, the light having a wavelength shorter than 160 nm has a great influence on the resist pattern 13, so that the dissociation of side chains and the like of a component contained in the resist pattern 13, the decrease in the internal stress, and the crosslinking reaction can be promoted. On the other hand, in order to improve the film quality of the resist pattern 13 as a whole, since light having a wavelength longer than 16 nm is also required, the film quality can be improved by irradiating the resist pattern 13 with an appropriate balance.

The light source 42 generates top-hat type light whose intensity distribution is flat compared to light of Gaussian distribution. Even with top-hat type light, the intensity distribution thereof is not completely flat. That is, spread light emitted from a point light source 44 (see FIG. 1) in the light source 42 is radiated, and specifically, vacuum ultraviolet light having a conical optical path with the point light source 44 as an apex is irradiated toward the wafer W. In this way, the light emitted from the light source 42 has a circular irradiation range on the irradiation surface. In FIG. 3, the forecast of the propagation range of light output from each light source 42 on the surface of the wafer W is indicated by a broken line.

Since the VUV light reacts with oxygen in an oxygen-existing atmosphere, the effect of improving the roughness of the resist pattern 13 may be reduced. Therefore, as described later, a vacuum atmosphere is formed inside the housing 21 in order to remove oxygen in the housing 21 when the wafer W is processed. Here, molecules having a relatively small molecular weight, which are generated by breaking the bonds by the light irradiation as described above, are easily released as a gas into the vacuum atmosphere. A gas is generated by decomposition and crosslinking regardless of the wavelength penetration range. Light having a long wavelength reaches the deep portion of the resist pattern 13, but before that, the crosslinking reaction by the light having a short wavelength proceeds (predominantly works), which may make it possible to suppress a change in the outer shape such as the height, width, and the like of the resist pattern 13.

Figure 4:
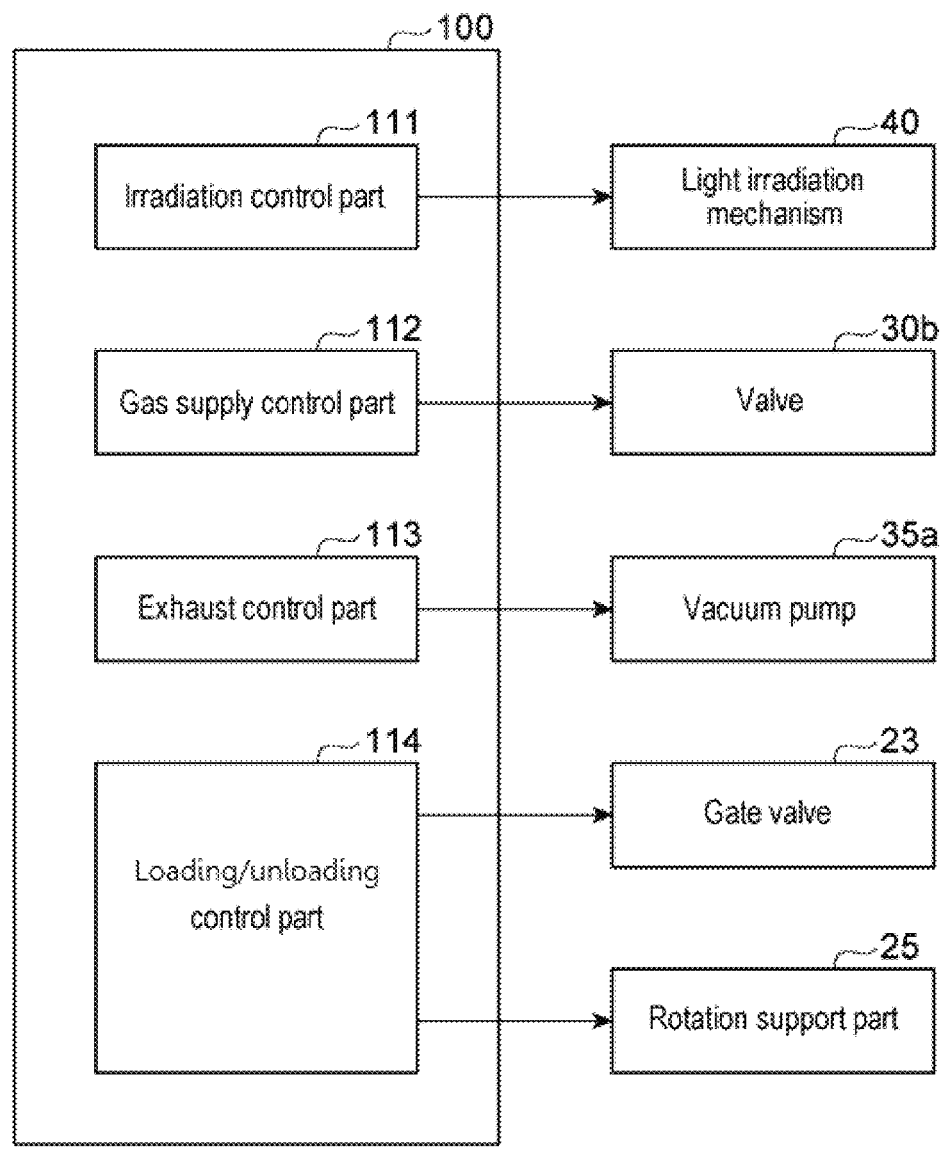
FIG. 4 is a block diagram illustrating a functional configuration of a controller.

Returning to FIG. 1, the controller 100 of the substrate processing apparatus 1 controls the rotation support part 25, the gas supply part 30, the gas discharge part 35, and the light irradiation mechanism 40. As illustrated in FIG. 4, the controller 100 has an irradiation control part 111, a gas supply control part 112, an exhaust control part 113, and a loading/unloading control part 114 as functional configurations (hereinafter, referred to as "functional modules"). These functional modules are merely the functions of the controller 100 divided into a plurality of modules for the sake of convenience in description, and do not necessarily mean that the hardware constituting the controller 100 is divided into such modules.

The irradiation control part 111 controls the light irradiation mechanism 40 to irradiate the VUV light at a desired timing. For example, the irradiation control part 111 controls the light irradiation mechanism 40 to turn on all the light sources 42 prior to the irradiation timing. Further, the irradiation control part 111 controls the light irradiation mechanism 40 to turn off all the light sources 42 after completion of the irradiation timing.

The gas supply control part 112 controls the valve 30b to supply the inert gas into the housing 21 through the through-hole 21a. The exhaust control part 113 controls the vacuum pump 35a to exhaust a gas in the housing 21 to the outside through the through-hole 21b.

The loading/unloading control part 114 controls the gate valve 23 to open/close the transfer port 22 in accordance with loading/unloading of the wafer W into/from the housing 21, and controls the rotation support part 25 to switch between holding and releasing of the wafer W by the holder 26.

Figure 5:
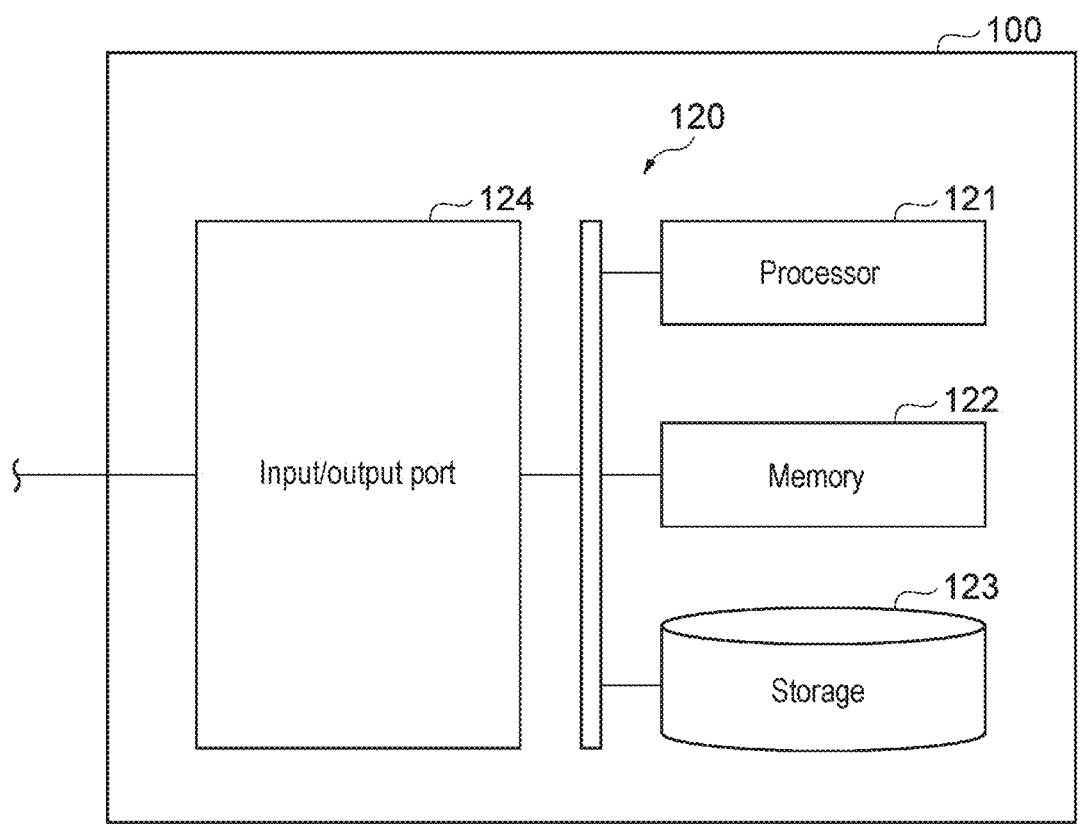
FIG. 5 is a block diagram illustrating a hardware configuration of the controller.

The controller 100 is configured by one or more control computers. For example, the controller 100 has a circuit 120 illustrated in FIG. 5. The circuit 120 includes one or more processors 121, a memory 122, a storage 123, and an input/output port 124. The storage 123 has a non-transitory computer-readable storage medium such as a hard disk. The storage medium stores a program for causing the substrate processing apparatus 1 to execute a substrate processing procedure to be described later. The storage medium may be a removable medium such as a nonvolatile semiconductor memory, a magnetic disk, an optical disk or the like. The memory 122 temporarily stores the program loaded from the storage medium of the storage 123 and results of calculation by the processor 121. The processor 121 configures each functional module described above by executing the above program in cooperation with the memory 122. The input/output port 124 inputs/outputs an electric signal from to each part controlled by the controller 100 according to a command from the processor 121.

The hardware configuration of the controller 100 is not necessarily limited to one that configures each functional module by a program. For example, each functional module of the controller 100 may be configured by a dedicated logic circuit or an ASIC (Application Specific Integrated Circuit) in which the dedicated logic circuit is integrated.

[Substrate Processing Method]

Figure 6:
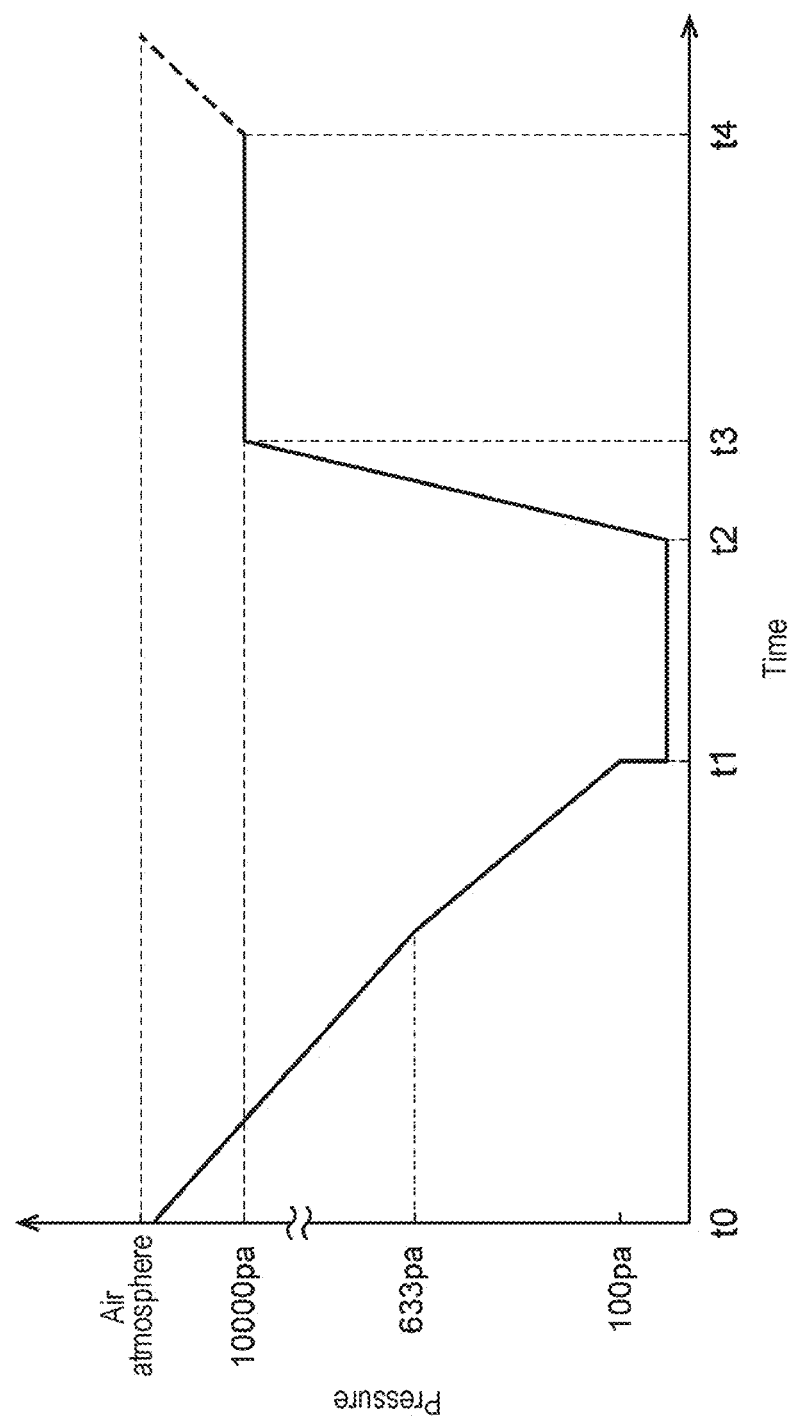
FIG. 6 is a diagram illustrating a change in pressure during substrate processing in the substrate processing apparatus.

Next, the operation (substrate processing method) of the substrate processing apparatus 1 will be described with reference to FIGS. 1 and 6. FIG. 6 is a graph showing an outline of change in pressure with time inside the housing 21. In the graph of FIG. 6, the horizontal axis represents the elapsed time during the processing, and the vertical axis represents the internal pressure (unit: Pa) of the housing 21 that is a processing container, which is a schematic logarithmic axis. First, the wafer W is loaded into the housing 21 by the transfer mechanism while the operations of the gas supply part 30 and the gas discharge part 35 are stopped. When the wafer W is placed on the holder 26 of the rotation support part 25, the gate valve 23 is closed to make the interior of the housing 21 airtight. At this time, the interior of the housing 21 is set to, for example, at atmospheric environment of standard atmospheric pressure (time t0 in FIG. 6). After that, the internal pressure of the housing 21 is decreased with the operation of the gas discharge part 35.

When the internal pressure of the housing 21 reaches 1 Pa (time t1) as the pressure decrease progresses, the internal pressure of the housing 21 is maintained for a predetermined time. After the pressure decrease state of 1 Pa is maintained for a while (time t2), the valve 30b of the gas supply part 30 is opened and an Ar gas is supplied into the housing 21. As a result, an Ar gas atmosphere is formed in the housing 21, and the internal pressure of the housing 21 increases. In addition, the pressure decrease rate and the pressure increase rate can be controlled by the operations of the gas supply part 30 and the gas discharge part 35. Further, the pressure decrease rate and the pressure increase rate may be constant or may be changed midway.

For example, when the internal pressure of the housing 21 reaches 10,000 Pa by the Ar gas, the light source 42 irradiates the wafer W with light including VUV light while maintaining the internal pressure of the housing 21 (time 3). After the light source 42 irradiates the wafer W with the light for a predetermined time, for example, 30 seconds, the light irradiation is stopped (time t4). After that, the operations of the gas supply part 30 and the gas discharge part 35 are stopped, the internal pressure of the housing 21 is returned to the air atmosphere, and then the wafer W is unloaded from the housing 21. With the above, the processing of the wafer W by the substrate processing apparatus 1 is completed.

In this way, in the substrate processing apparatus 1, even when the light source 42 irradiates the wafer W with the light, the supply of gas by the gas supply part 30 and the discharge of gas by the gas discharge part 35 are performed. Therefore, it can be said that the Ar gas is replaced while the internal pressure of the housing 21 is maintained.

The internal pressure of the housing 21 may be constant or gradually changed during the irradiation of the wafer W with the light from the light source 42 (between time 3 and time t4). In the example shown in FIG. 6, the internal pressure of the housing 21 is set to 10,000 Pa during the irradiation of the wafer W with the light from the light source 42 in order to suppress the outgas from the surface of the wafer W. However, it is conceivable that the amount of generation of the outgas gradually decreases during the irradiation of the wafer W with the light from the light source 42. In this case, control may be performed by gradually decreasing the internal pressure of the housing 21. With such a configuration, it is possible to irradiate the wafer W with the light in a state closer to a vacuum.

[Substrate Processing for Resist Material for ArF Immersion Exposure]

Here, in the substrate processing apparatus 1 according to the present embodiment, the following has been found in a case where the resist material used for the resist pattern 13 is a material suitable for immersion lithography using an ArF immersion exposure apparatus using an ArF laser (wavelength of 193 nm) as an exposure light source. That is, by irradiating the wafer W with the light including the VUV light under a predetermined condition, it has been founded that the surface roughness of the resist pattern 13 is improved and the surface roughness of a pattern obtained by performing an etching process using the resist pattern 13 as a mask is also improved. In the following embodiment, the improvement of surface roughness when the resist material is a material used for ArF immersion lithography will be described.

As described above, the composition of the resist material suitable for ArF immersion lithography is adjusted so as to be exposed by the ArF laser (wavelength of 193 nm). Therefore, it is considered that the optimal conditions for this processing with the VUV light including the same wavelength 193 nm as the exposure wavelength for the resist material for ArF immersion lithography are different from those of resist materials corresponding to other exposure wavelengths. Even when the material is exposed at another wavelength included in the VUV light, the influence on the pattern changes depending on the wavelength of the light. Therefore, it is necessary to examine the optimal conditions for each resist material corresponding to each exposure condition. In the following embodiment, a case of using a general resist material for ArF immersion lithography will be described. The resist material may contain an additive such as an acid generator, a solvent, a decomposed product, and the like.

As described above, by irradiating the wafer W with the light including the VUV light in substrate processing apparatus 1, chemical bonds at various positions in molecules constituting the resist pattern 13 are broken in the wafer W, thus generating various compounds. At this time, since the chemical bonds are broken at various positions, it is considered that the roughness of the surface of the resist pattern 13 is alleviated. In addition, the surface of the resist pattern 13 is hardened by the crosslinking reaction that occurs during and after the irradiation of the wafer W with the light including the VUV light, and as a result, the etching resistance becomes high. That is, by the irradiation of the wafer W with the VUV light, the breaking of chemical bonds in the resist pattern 13 and the crosslinking reaction appropriately proceed. The chemical bond breaking and the crosslinking reaction can improve the roughness of the resist pattern 13 and the surface of the underlying film etched using the resist pattern 13 as a mask.

However, if either the chemical bond breaking or the crosslinking reaction in the resist pattern 13 is insufficient or excessive, the effect of improving the surface roughness becomes low. In other words, by appropriately adjusting the degree of irradiation of the wafer W with the light including the VUV light in the substrate processing apparatus 1, the effect of improving the surface roughness can be enhanced. Regarding this point, the verified results will be described below. In particular, the resist material for ArF immersion lithography has high responsiveness to the light from the light source 42, including the VUV light, so that the effect of improving the surface roughness changes depending on its intensity and the like. This point will also be described.

Factors that change the irradiation conditions when irradiating the resist pattern 13 with the VUV light in the substrate processing apparatus 1 may include "dose (accumulated irradiation amount)", "Ar flow rate during irradiation", "wafer rotation speed during irradiation", and "light source current correction value (offset)". Of these, the "dose" corresponds to the total energy of the light (VUV light) emitted from the light source 42 to the resist pattern 13. The "Ar flow rate during irradiation" and the "light source current correction value" are related to the permeability of the light emitted from the light source 42. That is, it affects how much the VUV light reaches the resist pattern 13. Further, the "wafer rotation speed" affects to what extent the VUV light emitted from the light source 42 produces an effect on modifying the resist pattern 13. The results of evaluation performed while changing the conditions related to the above factors will be described below.

(Evaluation Regarding the Amount of Change in Line Width)

(Evaluation Test 1)

In Evaluation test 1, a change in line width (CD: Critical Dimension) when an Ar flow rate during irradiation with light from the light source 42 was changed with two conditions was evaluated. The evaluation targets are a resist pattern 13 and a pattern in an underlying film when the underlying film is etched using the resist pattern 13 as a mask.

First, as a wafer W to be evaluated, the wafer W having the resist pattern 13 formed on the SOC film 11 and the SOG film 12 was prepared. The pattern width of the wafer W was set to 45 nm.

The wafer W having the resist pattern 13 formed on its surface was accommodated in the housing 21 of the substrate processing apparatus 1, and the interior of the housing 21 was depressurized. When the interior of the housing 21 reached a set pressure, light was emitted from the light source 42. A series of operations is the same as the above-described substrate processing method. The irradiation amount was changed in 5 steps between 0 mj/cm$^2$ and 150 mj/cm$^2$ (5 steps of 25.1, 42.5, 75.2, 107.8, and 149). Then, the line width (CD) was measured for each of the resist pattern 13 and the pattern in the underlying film when the underlying film was etched using the resist pattern 13 as a mask. At this time, the rotation speed of the wafer (the rotation speed of the wafer during irradiation with a predetermined dose of light) was set to 3, and the lamp correction value (the light source current correction value) was set to 2.5. In the following embodiments, the resist pattern 13 may be referred to as ADI (After Development Inspection), and the pattern in the underlying film may be referred to as AEI (After Etch Inspection).

Figure 7:
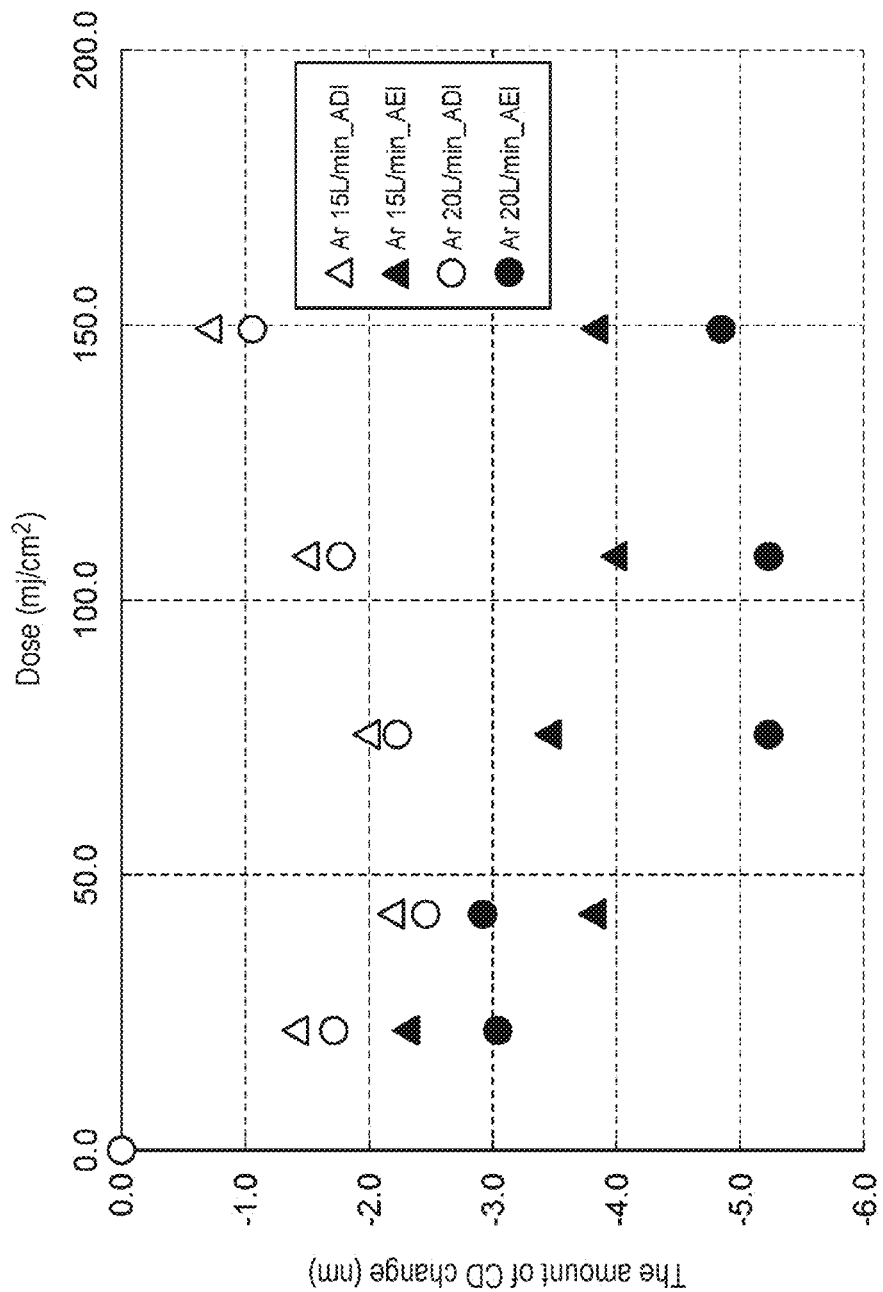
FIG. 7 is a diagram showing an example of the results of Evaluation test 1.

FIG. 7 shows the measurement results of the line width (CD) when the Ar flow rate during light irradiation by the light source 42 is 15 L/min and 20 L/min, respectively. In FIG. 7, with the measurement result when irradiation with light from the light source 42 including the VUV light using the substrate processing apparatus 1 is not performed, set as a reference value, it is plotted how much the line width is changed with respect to the reference value.

(Evaluation Test 2)

In Evaluation test 2, when the rotation speed of the wafer during irradiation with light from the light source 42 was changed with three conditions, a change in line width (CD) in the resist pattern 13 (ADI) and the underlying film pattern (AEI) was evaluated.

The wafer W having the resist pattern 13 formed on its surface was stored in the housing 21 of the substrate processing apparatus 1, and the interior of the housing 21 was depressurized. When the interior of the housing 21 reached a set pressure, light was emitted from the light source 42. A series of operations is the same as the above substrate processing method. The irradiation amount was changed in 3 steps between 0 mj/cm$^2$ and 150 mj/cm$^2$ (3 steps of 25.1, 75.2, and 149). Then, the line width (CD) was measured for each of the resist pattern 13 (ADI) and the underlying film pattern (AEI). At this time, the Ar flow rate was set to 20 L/min, and the lamp correction value was set to 2.5.

Figure 8:
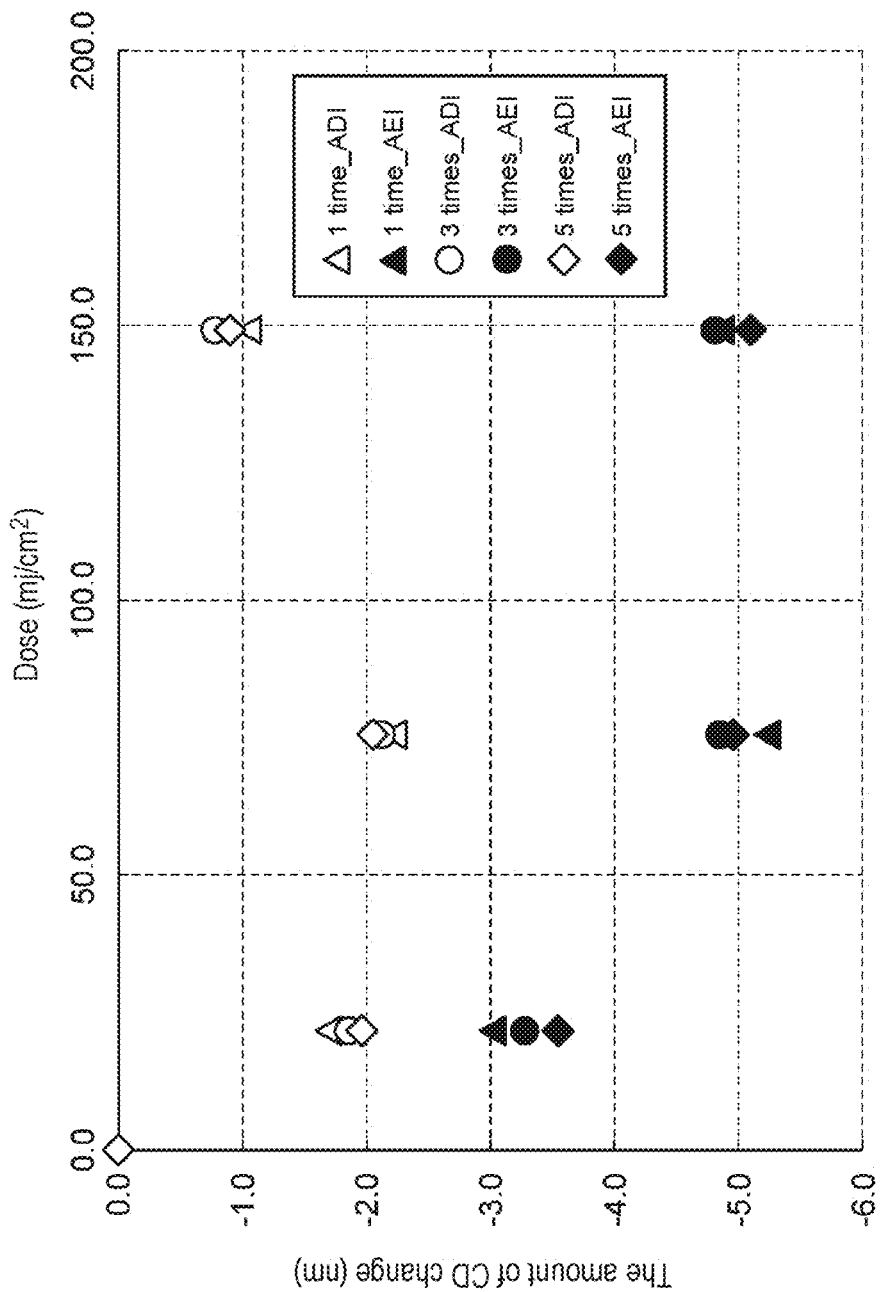
FIG. 8 is a diagram showing an example of the results of Evaluation test 2.

FIG. 8 shows the measurement results of the line width (CD) when the rotation speed of the wafer during light irradiation by the light source 42 (the number of rotations of the wafer during irradiation with a predetermined amount of light) is 1 rotation, 3 rotations, and 5 rotations. In FIG. 8, with the measurement result when irradiation with light from the light source 42 including the VUV light using the substrate processing apparatus 1 is not performed, set as a reference value, it is plotted how much the line width is changed with respect to the reference value.

(Evaluation Test 3)

In Evaluation test 3, when the lamp current correction value during irradiation with light from the light source 42 was changed with two conditions, a change in line width (CD) in the resist pattern 13 (ADI) and the underlying film pattern (AEI) was evaluated.

The wafer W having the resist pattern 13 formed on its surface was stored in the housing 21 of the substrate processing apparatus 1, and the interior of the housing 21 was depressurized. When the interior of the housing 21 reached a set pressure, light was emitted from the light source 42. A series of operations is the same as the above substrate processing method. The irradiation amount was changed in 5 steps between 0 mj/cm$^2$ and 150 mj/cm$^2$ (5 steps of 25.1, 42.5, 75.2, 107.8, and 149). Then, the line width (CD) was measured for each of the resist pattern 13 (ADI) and the underlying film pattern (AEI). At this time, the Ar flow rate was set to 20 L/min, and the rotation speed of the wafer was set to 3.

Figure 9:
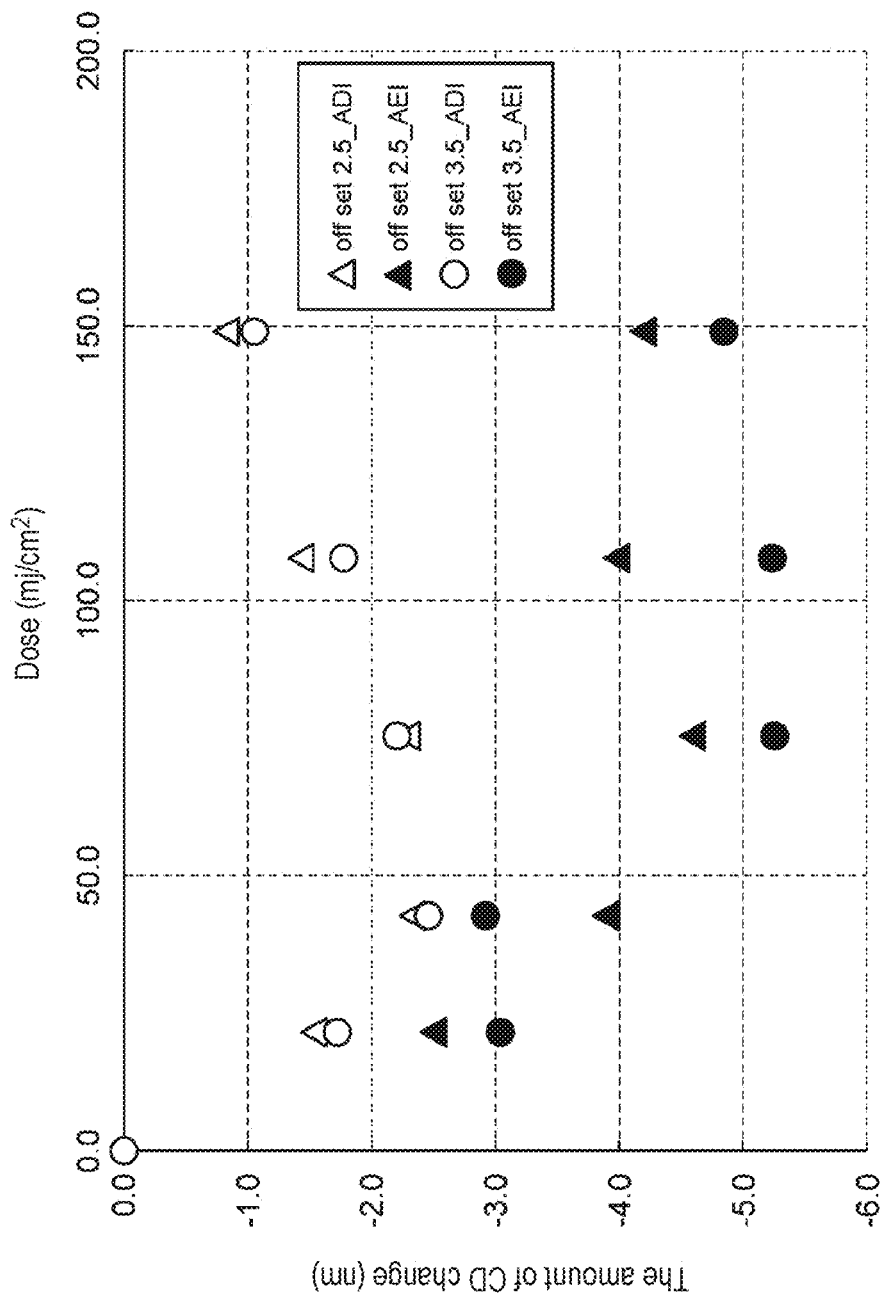
FIG. 9 is a diagram showing an example of the results of Evaluation test 3.

FIG. 9 shows the measurement results of the line width (CD) when the lamp correction value (current correction value) in the light source 42 is 2.5 and 3.5. In FIG. 9, with the measurement result when irradiation with light from the light source 42 including the VUV light using the substrate processing apparatus 1 is not performed, set as a reference value, it is plotted how much the line width is changed with respect to the reference value.

(Results of Evaluation Tests 1 to 3)

In all of FIGS. 7 to 9, the line width of the resist pattern (ADI) is the smallest in the vicinity of a dose of 50 mj/cm$^2$, and then gradually increases as the dose increases. The line width of the underlying film pattern (AEI) is the smallest at a dose of 50 mj/cm 2, and then becomes substantially constant as the dose increases.

In both the resist pattern (ADI) and the underlying film pattern (AEI), since the line width is gradually reduced until the dose is close to 50 mj/cm$^2$, it is considered that a reaction in the resist pattern is insufficient (the dose is insufficient). On the other hand, when the dose exceeds 50 mj/cm$^2$, the line width of the resist pattern (ADI) becomes large, but the line width of the underlying film pattern (AEI) remains unchanged. From this, it is presumed that the etching resistance of the resist pattern 13 is enhanced as a result of the bond breaking and the crosslinking reaction within the resist pattern 13 being sufficiently performed at a dose of about 50 mj/cm$^2$. Therefore, it is considered that the line width of the underlying film pattern (AEI) is kept constant to some extent even when the dose is changed. However, in the resist pattern 13, the line width is increased when the dose is increased from 50 mj/cm$^2$. From this, it is considered that when the dose is increased from 50 mj/cm$^2$, the chemical bond is excessively broken as compared with the crosslinking reaction, which may place the resist pattern 13 in a so-called sagging state. From this, it is considered that the reaction by the irradiation with the VUV light in the resist pattern (ADI) can be appropriately advanced by setting the dose to about 50 mj/cm$^2$.

In addition, the line width of the underlying film pattern (AEI) under the condition of Ar 20 mL/min in FIG. 7 is smaller than that of the underlying film pattern (AEI) under the condition of Ar 15 mL/min. Further, the line width of the underlying film pattern (AEI) under the condition of the lamp correction value 3.5 in FIG. 9 is smaller than that of the underlying film pattern (AEI) under the condition of the lamp correction value 2.5. It is considered that this suggests that the irradiation with the light from the light source 42 causes the reaction in the resist pattern 13 to proceed excessively, thereby reducing the etching resistance in the resist pattern 13.

As described above, both the Ar flow rate and the lamp correction value are related to the permeability of the light emitted from the light source 42. For example, the Ar flow rate is a flow rate of Ar supplied into the housing 21 while maintaining the interior of the housing 21 at a predetermined pressure during light irradiation. Therefore, as the flow rate of Ar increases, the amount of gas discharge from the housing 21 to the outside also increases, so that the discharge of impurities (sublimates, etc.) generated in the housing 21 to the outside is also promoted. On the contrary, when the flow rate of Ar decreases, impurities generated in the housing 21 tend to stay in the housing 21. Therefore, a portion of the light emitted from the light source 42 is absorbed or diffused by impurities or the like. As a result, the spectrum of light with which the wafer W is irradiated may change with respect to the light from the light source 42. In this way, the Ar flow rate is a factor that may affect the permeability and wavelength characteristics of the light emitted from the light source 42.

In addition, the lamp correction value is a value related to the intensity of the light emitted from the light source 42. As the lamp correction value increases, the intensity of the light from the light source 42 is increased, and thus the amount of light reaching the resist pattern 13 is increased. In this way, the amount of light reaching the resist pattern 13 is large in both cases of increasing the Ar flow rate and increasing the lamp correction value. Therefore, a reaction in the resist pattern 13 can proceed as compared with a case of reducing the Ar flow rate or a case of reducing the lamp correction value. Further, even under the condition that the resist pattern 13 is irradiated with the same dose of light, the line width of the resist pattern 13 (ADI) does not change due to the increase in the Ar flow rate or the lamp correction value. On the other hand, the line width of the underlying film pattern (AEI) is changed to be smaller. From this, it is presumed that the function of the upper-lying resist pattern 13 as a mask is lowered during etching.

(Evaluation Regarding Improvement of Surface Roughness)
(Evaluation Test 4)

In Evaluation test 4, when the Ar flow rate during irradiation with light from the light source 42 was changed with two conditions, a change in LWR (line width roughness) of a resist pattern 13 and a pattern in an underlying film when the underlying film was etched using the resist pattern 13 as a mask was evaluated. The LWR is an index of pattern roughness. The lower the value of LWR, the smaller the surface roughness of the pattern.

As the evaluation target, the wafer W having the resist pattern 13 formed on the SOC film 11 and the SOG film 12 was prepared. The pattern width of the wafer W was set to 45 nm.

The wafer W having the resist pattern 13 formed on its surface was stored in the housing 21 of the substrate processing apparatus 1, and the interior of the housing 21 was depressurized. When the interior of the housing 21 reached a set pressure, light was emitted from the light source 42. A series of operations is the same as the above substrate processing method. The irradiation amount was changed in 5 steps between 0 mj/cm$^2$ and 150 mj/cm$^2$ (5 steps of 25.1, 42.5, 75.2, 107.8, and 149). Then, the LWR was measured for each of the resist pattern 13 (ADI) and the underlying film pattern (AEI) when the underlying film was etched using the resist pattern 13 as a mask. At this time, the rotation speed of the wafer (the rotation speed of the wafer during irradiation with a predetermined dose of light) was set to 3, and the lamp correction value was set to 2.5.

Figure 10:
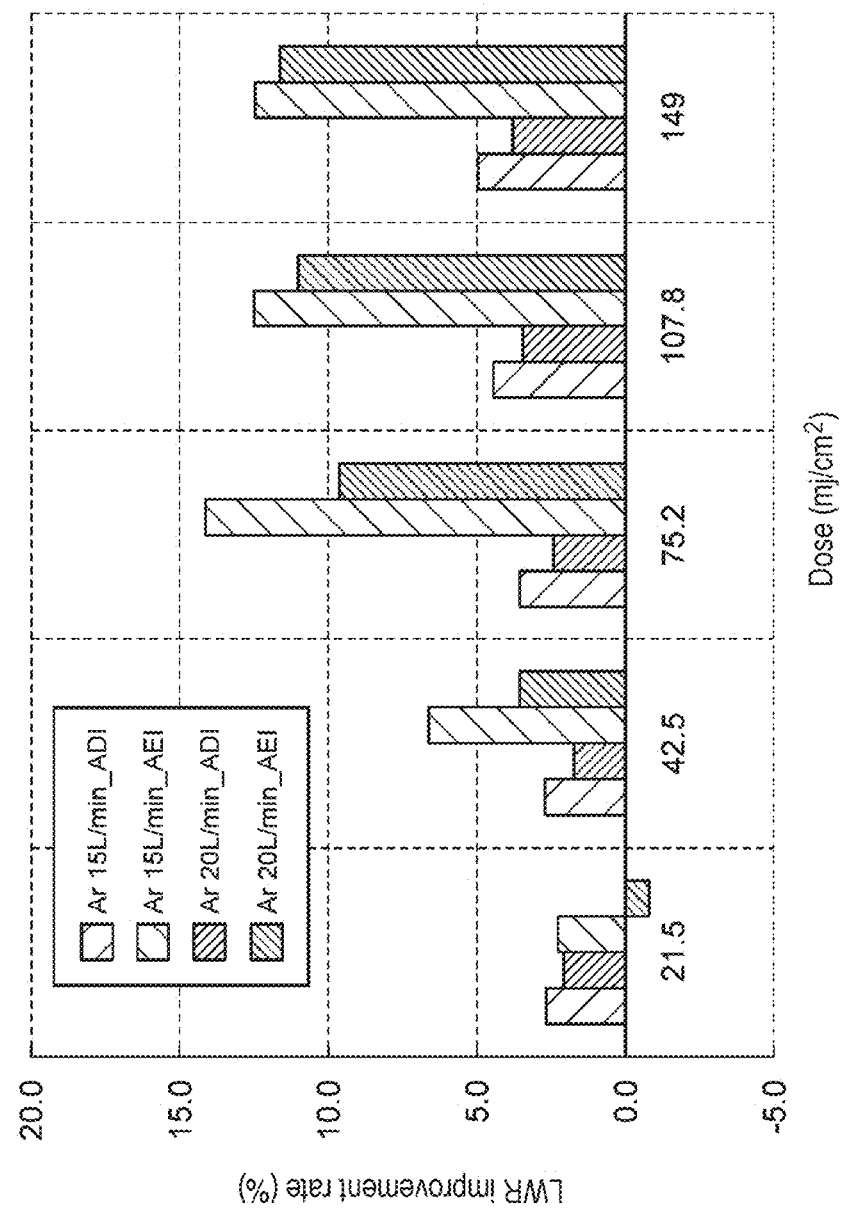
FIG. 10 is a diagram showing an example of the results of Evaluation test 4.

FIG. 10 shows the measurement results of the LWR when the Ar flow rate during light irradiation by the light source 42 is 15 L/min and 20 L/min, respectively. In FIG. 10, with the measurement result when irradiation with light from the light source 42 including the VUV light using the substrate processing apparatus 1 is not performed, set as a reference value, how much the surface roughness is improved with respect to the reference value was calculated as an improvement rate and is shown in a bar graph. The improvement rate was calculated using a mathematical formula of (LWR under each condition−reference value)/(reference value)×100(%).

(Evaluation Test 5)

In Evaluation test 5, when the rotation speed of the wafer during irradiation with light from the light source 42 was changed with three conditions, a change in LWR in the resist pattern 13 (ADI) and the underlying film pattern (AEI) was evaluated.

The wafer W having the resist pattern 13 formed on its surface was stored in the housing 21 of the substrate processing apparatus 1, and the interior of the housing 21 was depressurized. When the interior of the housing 21 reached a set pressure, light was emitted from the light source 42. A series of operations is the same as the above substrate processing method. The irradiation amount was changed in 3 steps between 0 mj/cm$^2$ and 150 mj/cm$^2$ (3 steps of 25.1, 75.2, and 149). Then, the LWR was measured for each of the resist pattern 13 (ADI) and the underlying film pattern (AEI). At this time, the Ar flow rate was set to 20 L/min, and the lamp correction value was set to 2.5.

Figure 11:
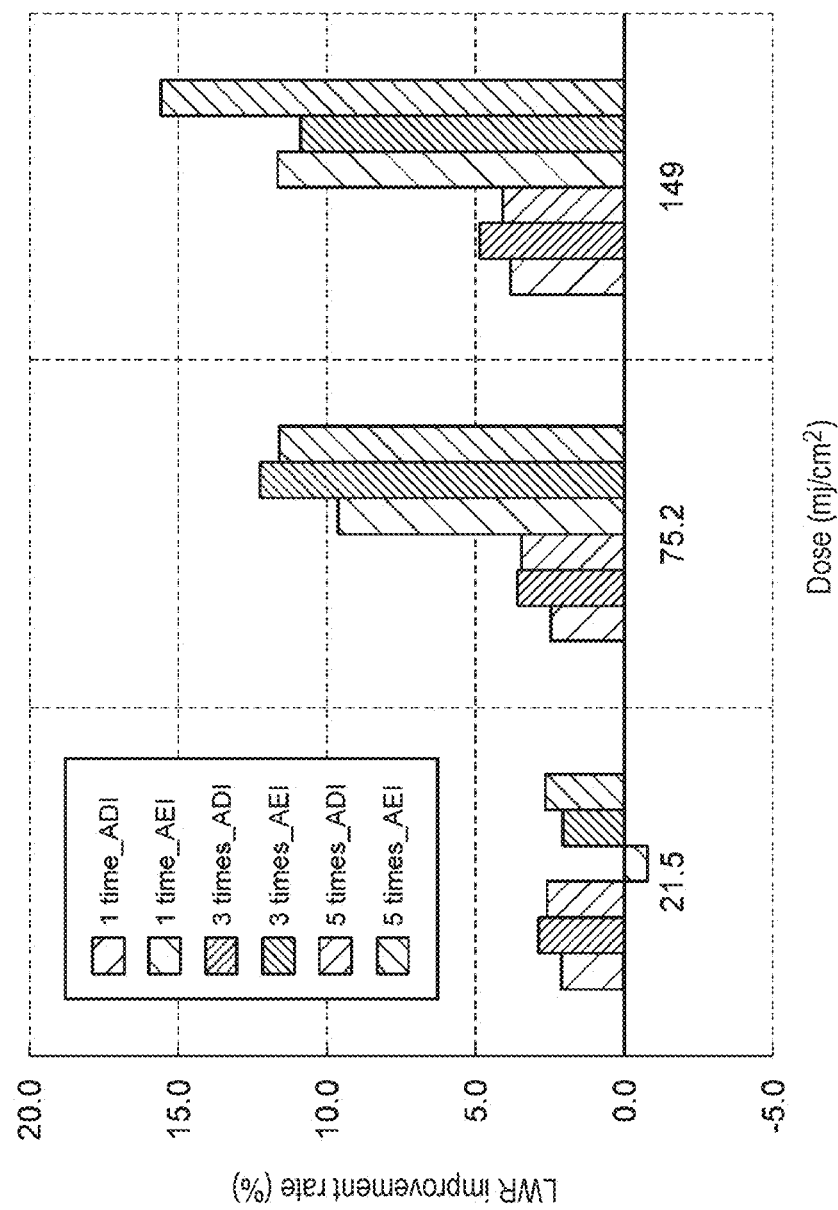
FIG. 11 is a diagram showing an example of the results of Evaluation test 5.

FIG. 11 shows the measurement results of the LWR when the rotation speed of the wafer during light irradiation by the light source 42 (the number of rotations of the wafer during irradiation with a predetermined amount of light) is 1 rotation, 3 rotations, and 5 rotations. In FIG. 11, with the measurement result when irradiation with light from the light source 42 including the VUV light using the substrate processing apparatus 1 is not performed, set as a reference value, an improvement rate indicating how much the LWR is changed with respect to the reference value is calculated and is shown in a bar graph.

(Evaluation Test 6)

In Evaluation test 6, when the lamp current correction value during irradiation with light from the light source 42 was changed with two conditions, a change in LWR in the resist pattern 13 (ADI) and the underlying film pattern (AEI) was evaluated.

The wafer W having the resist pattern 13 formed on its surface was stored in the housing 21 of the substrate processing apparatus 1, and the interior of the housing 21 was depressurized. When the interior of the housing 21 reached a set pressure, light was emitted from the light source 42. A series of operations is the same as the above substrate processing method. The irradiation amount was changed in 5 steps between 0 mj/cm$^2$ to 150 mj/cm$^2$ (5 steps of 25.1, 42.5, 75.2, 107.8, and 149). Then, the LWR was measured for each of the resist pattern 13 (ADI) and the underlying film pattern (AEI). At this time, the Ar flow rate was set to 20 L/min, and the rotation speed of the wafer was set to 3.

Figure 12:
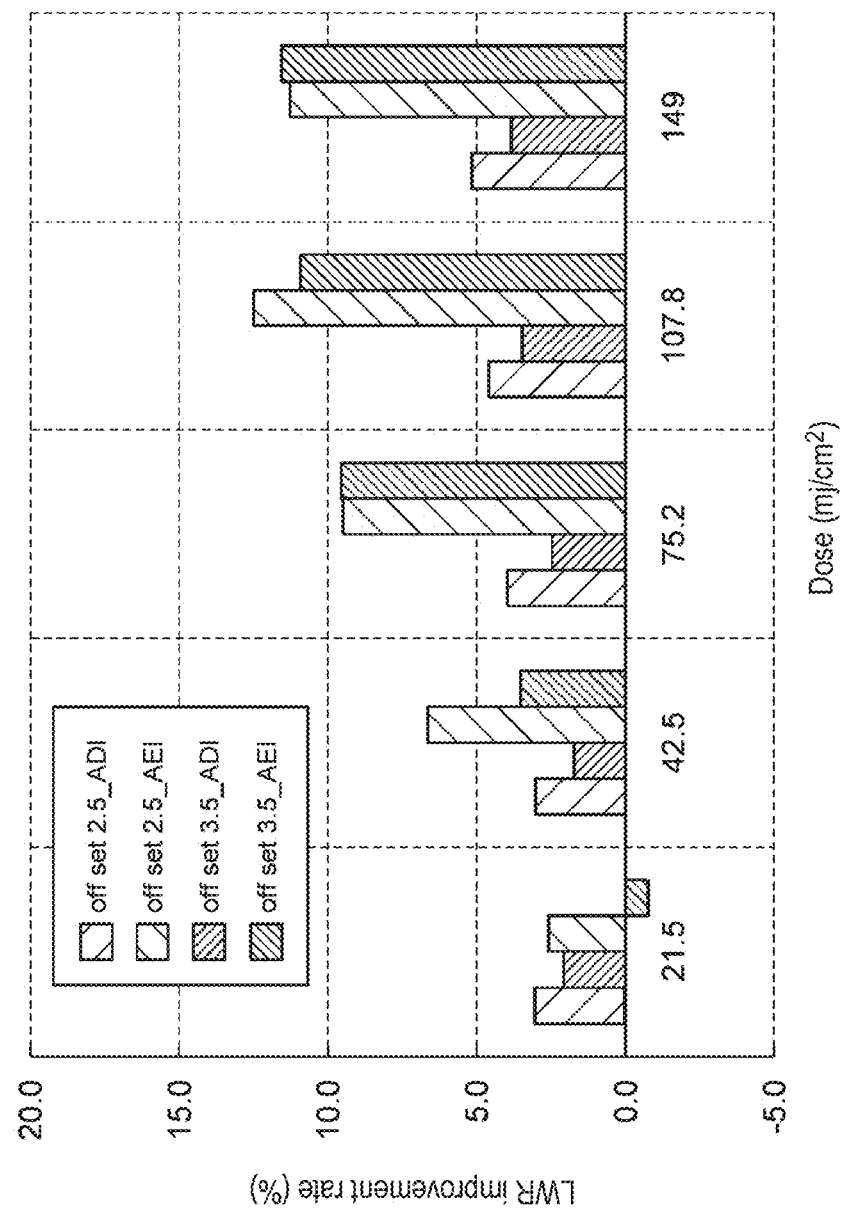
FIG. 12 is a diagram showing an example of the results of Evaluation test 6.

FIG. 12 shows the measurement results of the LWR when the lamp correction value (current correction value) in the light source 42 is 2.5 and 3.5. In FIG. 1, with the measurement result when irradiation with light from the light source 42 including the VUV light using the substrate processing apparatus 1 is not performed, set as a reference value, an improvement rate indicating how much the LWR is changed with respect to the reference value was calculated and is shown in a bar graph.

(Results of Evaluation Tests 4 to 6)

In all of FIGS. 10 to 12, the LWR of the underlying film pattern (AEI) was greatly improved when the dose is greater than 50 mj/cm$^2$. From this, it is considered that the irradiation with the light (VUV light) with the dose of about 50 mj/cm$_2$ realizes the sufficient modification of the resist pattern 13 to improve the roughness of the surface of the underlying film pattern (AEI). This has almost the same tendency as the results of Evaluation Tests 1 to 3 on the line width. In addition, it is considered that the improvement rate of LWR becomes stable when the dose becomes larger than 75 mj/cm$^2$.

Further, from the results of Evaluation Tests 1 to 3, although the possibility that the etching resistance in the resist pattern 13 is lowered when the Ar flow rate is 20 mL/min or the lamp correction value is 3.5 has been described, the same holds true in the results of Evaluation Tests 4 to 6. That is, the improvement rate of the LWR of the underlying film pattern (AEI) under the condition that the Ar flow rate is 20 mL/min in FIG. 7 tends to be smaller than the improvement rate of the LWR of the underlying film pattern (AEI) under the condition that the Ar flow rate is 15 mL/min. Further, the improvement rate of the LWR of the underlying film pattern (AEI) under the condition that the lamp correction value is 3.5 in FIG. 9 tends to be smaller than the improvement rate of the LWR of the underlying film pattern (AEI) under the condition that the lamp correction value is 2.5.

(Change in Light Irradiation Effect Due to Wafer Rotation)

Further, from the results shown in FIG. 11, although the influence of the rotation speed of the wafer W on the improvement rate of the LWR during the irradiation with the light including the VUV light from the light source 42 is slight, the improvement rate of the LWR tends to be larger when the rotation speed is larger. The reason why such a tendency is exhibited is considered that even when the resist pattern 13 is irradiated with the same dose of light (VUV light), the tendency of penetration of the light into the resist pattern 13 changes depending on the rotation speed.

Figure 13A:
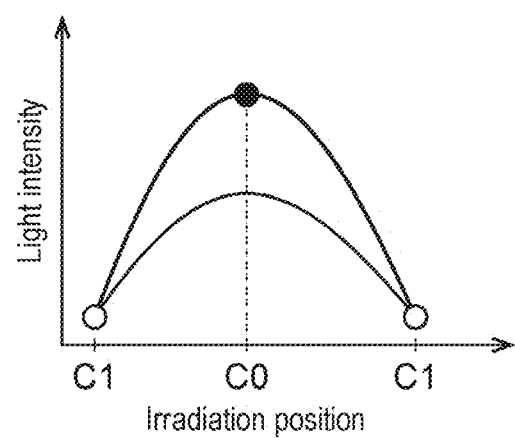
FIGS. 13A to 13D are diagrams illustrating a change in intensity of light received by a rotating substrate.

FIGS. 13A to 13D are diagrams for explaining a change in intensity of light received by a specific position on the wafer W when the wafer W rotates, due to a change in relative position between the specific position and the light source 42. FIG. 13A is a diagram illustrating the spread of light from the light source 42. An irradiation position C0 shown in FIG. 13A is a position (directly below) corresponding to the point light source 44 in the light source 42, at which position the intensity of the light from the light source 42 becomes maximum. On the other hand, as a distance from the irradiation position C0 corresponding to the point light source 44 increases, the light intensity decreases and becomes minimum at an end irradiation position C1. In this way, the light amount greatly changes according to the positional relationship with the light source 42. Therefore, in the substrate processing apparatus 1, an attempt can be made to make the amount of light received at each position on the surface of the wafer W uniform to some extent by rotating the wafer W.

Figure 13B:
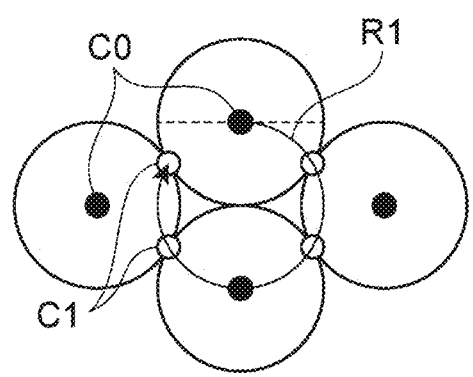
Figure 13C:
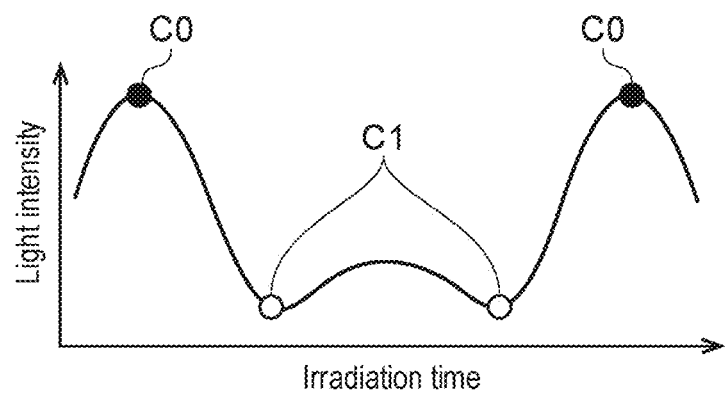
Figure 13D:
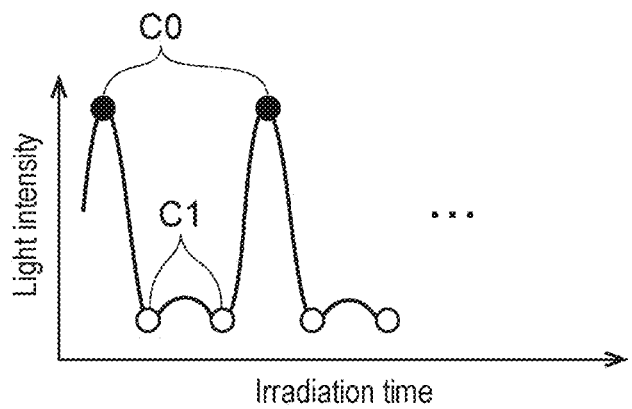

FIG. 13B schematically shows the movement of one specific point (here, referred to as a specific point) of the wafer W relative to the light source 42 when the wafer W is rotated, which is indicated by an arrow R1. FIG. 13B shows a state in which the four light sources 42 are arranged at positions corresponding to the irradiation position C0. Then, by rotating the wafer W, the specific point on the wafer W is rotated along the arrow R1. At this time, the wafer W passes through two irradiation positions C0 and four irradiation positions C1. As described above, the irradiation position C0 is a position where the intensity of the light from the light source 42 becomes maximum, while the irradiation position C1 is a position where the intensity of the light from the light source 42 becomes minimum. That is, when the specific point on the wafer W moves (rotates) along the arrow R1, the intensity of light received by the specific point changes as the specific point passes through both the irradiation position C0 and the irradiation position C1. FIGS. 13C and 13D are diagrams schematically showing a change in intensity of light received by the specific point on the wafer W which is moved along the arrow R1. In the example shown in FIG. 13D, the rotation speed is increased as compared with that in FIG. 13C. Even when the rotation speed is increased, since the movement path of the specific point (corresponding to the arrow R1) does not change, the specific point passes through both the irradiation positions C0 and C1. However, when the rotation speed is high, a speed at which the intensity of light received by the specific point changes also increases.

In a state where the light intensity of the light from the light source 42 is high (for example, the irradiation position C0 in FIGS. 13A to 13D), both light in the wavelength range of high intensity in the VUV light and light in the wavelength range of low intensity easily penetrate into the resist pattern 13. On the other hand, in a state where the light intensity of the light from the light source 42 is low (for example, the irradiation position C1 in FIGS. 13A to 13D), the light in the wavelength range of high intensity in the VUV light penetrates into the resist pattern 13, whereas the light in the wavelength range of low intensity in the VUV light hardly penetrates into the resist pattern 13. That is, in the state where the light intensity is low, it is considered that, of the light of the components of respective wavelengths corresponding to the continuous spectrum of the VUV light, light in the wavelength region of a particularly low intensity is not sufficiently irradiated to promote the modification in the resist pattern 13.

In the case of a resist material suitable for ArF immersion lithography used in the present embodiment, the rotation speed is increased to some extent, and, for example, as shown in FIG. 13D, a state where the intensity of light with which the specific point is irradiated is high is repeated many times. With such a configuration, it is considered that each component corresponding to the continuous spectrum of VUV light can be appropriately permeated into the resist pattern 13 up to a desired position (permeation depth corresponding to light of each wavelength) of the resist pattern 13. Therefore, from the results shown in FIG. 12, it is considered that the tendency of increasing the LWR improvement rate is obtained by increasing the rotation speed. The specific rotation speed may be, for example, about 3 to 12 rotations of the wafer W while irradiating the wafer W with light of a dose of 50 mj/cm$^2$. For example, since the time required for one process is 63 seconds when the illuminance from the light source 42 is 0.8 mW/cm$^2$, this value is equivalent to the rotation speed of the holder 26 set to about 2 rpm to 12 rpm.

The rotation speed of the wafer W does not have to be constant during irradiation with light from the light source 42. As described above, as the rotation speed increases, light in the wavelength range of higher intensity in the VUV light easily penetrates into the resist pattern 13. Therefore, by irradiating the wafer W with the light from the light source 42 while changing the rotation speed, the irradiation with the light from the light source 42 can be adjusted so that light in a specific wavelength range is more likely to penetrate into the wafer W.

When a circular substrate such as the wafer W is rotated at a certain angular velocity, since the moving speeds with respect to the light source 42 are different from each other between the inner side (near the center) and the outer side (near the end) of the wafer W, the positional relationship between the wafer W and the light source 42 during rotation is greatly different. Specifically, as the distance from the center of rotation increases, the moving speed substantially increases. Thus, the moving speed with respect to the light source 42 is low in the inner side of the wafer W. and is high in the outer side of the wafer W. In addition, irradiation areas through which the wafer W passes during one rotation are significantly different from each other between the inner side and the outer side of the wafer W. For example, in the case where the light sources 42 are arranged as shown in FIG. 3, the wafer W passes through the irradiation areas of four inner light sources 42 in the inner side the wafer W during one rotation. On the other hand, the wafer W passes through the irradiation areas of eight light sources 42 in the outer side of the wafer W during one rotation. Therefore, the outer side of the wafer W passes through the irradiation areas where there are more light sources 42, so that the number of times of passing through the area of high light intensity increases. In this way, even when the wafer W rotates at a certain speed, light received by the resist pattern 13 on the surface of the wafer W (especially, a speed of change in intensity of the emitted light) may be different depending on the position of the wafer W (especially, the distance from the center of rotation). Therefore, as a result, it is considered that the degree of improvement in the roughness of the surface of the resist pattern 13 may vary depending on the position of the surface of the wafer W. Further, in the case of the arrangement shown in FIG. 3, the outer side of the wafer W repeatedly passes through an area where the light intensity by the light source 42 is high, and thus the time zone when the wafer W passes through one of the areas where the light intensity is low gets shorter. Therefore, the wafer W is strongly affected by the time zone in which the wafer W passes through an area where the intensity of light by the light source 42 is high, so that the modification of the resist pattern 13 with light is promoted.

Figure 14:
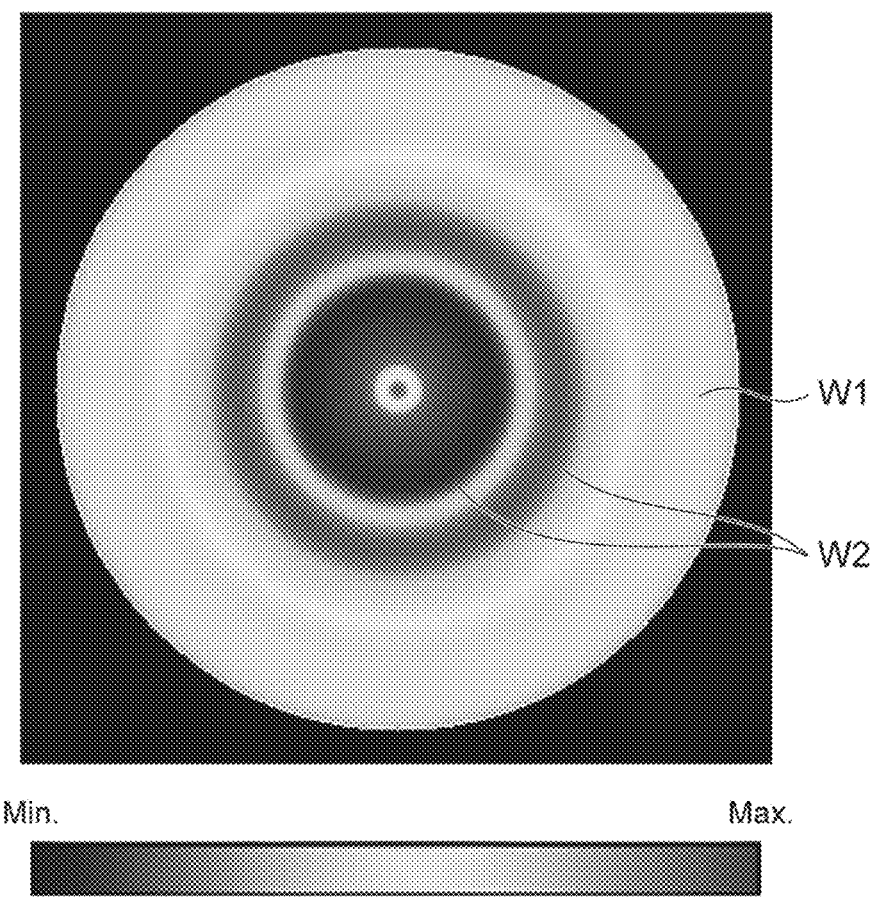
FIG. 14 is a view illustrating an illuminance distribution on a substrate.

FIG. 14 shows an example of the illuminance distribution of light (distribution of light irradiation amount) received at each position of the wafer W when light from the plurality of light sources 42 is emitted while rotating the wafer W. Here, it is assumed that the plurality of light sources 42 is arranged inside and outside as shown in FIG. 3. In the example shown in FIG. 14, it is confirmed that the illuminance of light received on the surface of the wafer W is deviated in the outer side and the inner side of the wafer W. Specifically, the illuminance of the received light is medium in an area W1 of the outer side of the wafer W, whereas the illuminance of the received light is low in an area W2 of the inner side of the wafer W (the area W2 is indicated by Min. side color). Further, near the center, there is an area between the area W1 and the area W2, in which the illuminance changes according to the distance from the center. The cause of such deviation of the illuminance of light may be that the moving speed of the wafer W with respect to the light sources 42 varies depending on the position of the wafer W as described above. Further, the cause may be that the way to pass through an area with high intensity (for example, the irradiation position C0 in FIGS. 13A to 13D) and an area with low intensity (for example, the irradiation position C1 in FIGS. 13A to 13D) among the irradiation areas in each light source 42 varies depending on each position of the wafer W. It is considered that such deviation of the illuminance distribution also affects the deviation of the effect of improving the roughness of the surfaces of the resist pattern 13 and the underlying film pattern.

When the deviation of the illuminance distribution occurs at each position (especially in the radial direction) on the surface of the wafer W, as a method for improving the deviation, it can be considered to change the intensity of light with which the wafer W is irradiated from the plurality of light sources 42.

A specific method of varying the intensity of light with which the wafer W is irradiated from the light sources 42 depending on the position of the wafer W (especially, in the inner side and the outer side) is not particularly limited. For example, it can be considered to change the arrangement of the light sources 42, the number of light sources 42, the intensity of light output from each light source 42, and the like. For example, among the 12 light sources 42 shown in FIG. 3, by setting the current correction values of the four inner light sources to 3.5 and the current correction values of the eight outer light sources to 2.5, the intensity of light output from the inner light sources 42 can be made higher than the intensity of light from the outer light sources. Further, the deviation of the illuminance distribution as shown in FIG. 14 can be reduced by changing the arrangement of the light sources without changing the current correction value and the like. As described above, the intensity of the light output from the light sources 42 greatly differs between the vicinity of the center (C0) and the vicinity of the end (C1) even within the irradiation area. In addition, the degree of light reaching the deep layer in the resist pattern 13 when passing through the area and the degree of modification of the resist pattern 13 based on the received light differ greatly between the vicinity of the center (C0) and the vicinity of the end (C1). Further, by arranging the adjacent light sources 42 so as to be close to each other so that the ends of the irradiation areas overlap each other, it is possible to increase the amount of light received by the wafer W when passing through the overlapping area. Therefore, the amount of light received by the resist pattern 13 can also be adjusted by adjusting the size of the overlapping area and the like. In this way, by changing various configurations particularly related to the light source 42, a configuration can be realized in which the intensity of light with which the wafer W is irradiated from the light source 42 varies depending on the position of the wafer W (especially, the inner side and the outer side).

The terms "inner side" and "outer side" of the wafer W indicate a relative positional relationship. Therefore, the boundary between the inner side and the outer side is not particularly limited. Depending on the number of light sources 42 and the arrangement thereof, a place where the deviation of the illuminance distribution along the radial direction of the wafer W occurs may change. However, since the wafer W is irradiated with the light from the light sources 42 while rotating the wafer W, the moving speed of the wafer W is low on the inner side and the moving speed of the wafer W is high on the outer side. Therefore, as a general tendency, the inner side of the wafer W is less likely to receive sufficient light for modifying the resist pattern 13 (breaking of chemical bonds and crosslinking reaction) than the outer side of the wafer W. In consideration of this point, the intensities of the light with which the wafer W is irradiated from the light sources 42 may differ between the inner side and the outer side of the wafer W.

Even when a material having high responsiveness to the light from the light source 42, such as the resist material for ArF immersion lithography described above, is used, there is a possibility that the modification (breaking of chemical bonds and crosslinking reaction on the surface) of the resist pattern 13 may not be sufficiently performed when the resist film has a large thickness. As described above, it is difficult for a component of light having a wavelength shorter than 160 nm, which is considered to be important for promoting the crosslinking reaction in the vicinity of the surface of the resist pattern 13, to reach the deep layer. Therefore, when the film thickness of the resist film forming the resist pattern 13 is increased, the progress of the modification may differ depending on the position of the resist pattern 13. Specifically, even when the modification by the light from the light source 42 is sufficiently advanced in the upper portion of the resist pattern 13 to increase the etching resistance, it is considered that the modification is not sufficiently advanced in the lower portion of the resist pattern 13 (the side close to the underlying film) so that the etching resistance does not increase. It has been confirmed that a component of light having a wavelength shorter than 160 nm penetrates only up to about 50 nm from the surface of the resist pattern 13. Therefore, the effect of improving the surface roughness due to the modification of the resist pattern 13 using the VUV light is considered to be particularly remarkable when the film thickness of the resist (height of the resist pattern 13) is smaller than 50 nm.

[Operations]

As described above, in the substrate processing apparatus 1 and the substrate processing method described above, the irradiation amount of light for the inner side of the substrate can be made larger than the irradiation amount of light on the outer side of the substrate. Therefore, the irradiation amount of light can be increased even on the inner side of the substrate, and thus the effect of improving the surface roughness can be enhanced. As described above, in the substrate having a pattern formed with the resist material for ArF immersion lithography on its surface, the degree of improvement of the surface roughness of the pattern is likely to change depending on the irradiation amount of light. Further, when the substrate is irradiated with light while rotating the substrate, it is considered that the moving speed of the substrate becomes slower on the inner side, and thus the irradiation amount of light becomes smaller. On the other hand, with the above configuration, the amount of light received by the pattern formed with the resist material on the substrate surface can be increased, and thus the effect of improving the surface roughness, especially on the inner side, can be enhanced.

In addition, in the substrate processing apparatus 1, the output intensity of the light source 42 that irradiates the inner side of the substrate with light can be set to be higher than the output intensity of the light source 42 that irradiates the outer side of the substrate with light. In this way, by increasing the output intensity of the light source 42 so that the amount of irradiation of the inner side of the substrate with light is larger than the amount of irradiation of the outer side of the substrate with light, the irradiation amount of light between the inner side and outer side of the substrate can be adjusted more easily. Further, the output intensity may be adjusted only in a portion of the time zone in which the substrate is irradiated with light. For example, the output of the light source corresponding to the outer side of the substrate may be lowered at the beginning or the end of irradiation, or the output of the light source corresponding to the inner side of the substrate may be increased at the beginning or the end of irradiation.

In addition, as described above, instead of setting the output intensity of the light source 42 that irradiates the inner side of the substrate with light to be higher than the output intensity of the light source 42 that irradiates the outer side of the substrate with light, the irradiation time for the inner side may be different from the irradiation time for the outer side. That is, by making the irradiation time of light by the light source 42 different between the inner side and the outer side of the substrate, the amount of irradiation of the inner side of the substrate with light can be larger than the amount of irradiation of the outer side of the substrate with light. For example, the irradiation may be started from the light source 42 that irradiates the inner side of the substrate with light before the light source 42 that irradiates the outer side of the substrate with light. Further, after stopping the light irradiation from the light source 42 that irradiates the outer side of the substrate with light, the light irradiation from the light source 42 that irradiates the inner side of the substrate may be stopped. In this way, by making the irradiation time of the light source 42 that irradiates the inner side of the substrate with light longer than the irradiation time of the light source 42 that irradiates the outer side of the substrate with light, the amount of irradiation of the inner side of the substrate with light may be made larger than the amount of irradiation of the outer side of the substrate with light. Furthermore, by combining the adjustment of the output intensity and the adjustment of the irradiation time described in the above embodiment, the amount of irradiation of the inner side of the substrate with light may be made larger than the amount of irradiation of the outer side of the substrate with light. In this case, it is possible to make the amount of irradiation of the inner side of the substrate with light larger than the amount of irradiation of the outer side of the substrate with light while making the irradiation time of the light source 42 that irradiates the inner side of the substrate with light shorter than the irradiation time of the light source 42 that irradiates the outer side of the substrate with light.

Further, the processing container has the gas supply part 30 for supplying an inert gas into the processing container and the gas discharge part 35 for discharging a gas from the processing container. At this time, during the irradiation with light by a light source, the gas supply part 30 and the gas discharge part 35 can be configured to supply and discharge the gas while changing the internal pressure of the processing container. With such a configuration, it is possible to irradiate the pattern with vacuum ultraviolet light while keeping the internal pressure of the processing container in a state according to the surface condition of the substrate.

Although various exemplary embodiments have been described above, the present disclosure is not limited to the above-described exemplary embodiments, but various omissions, substitutions, and changes may be made. Further, elements in different exemplary embodiments can be combined with each other to form other exemplary embodiments.

For example, the arrangement and number of light sources 42 in the substrate processing apparatus 1 may be changed as appropriate. In addition, a member or the like for controlling a path of light emitted from the light source 42 may be further added. Further, the arrangement and configuration of each part in the substrate processing apparatus 1 may be changed as appropriate. Further, the control of the pressure described in the above embodiment is an example, and the control of the internal pressure of the housing 21 may be changed, including the step before the irradiation with light from the light source 42.

According to the present disclosure in some embodiments, it is possible to provide a technique capable of improving a surface roughness in a substrate using a resist material suitable for ArF immersion lithography.

From the foregoing description, it should be understood that various exemplary embodiments of the present disclosure have been described herein for purposes of illustration and various changes may be made without departing from the scope and spirit of the present disclosure. Therefore, the various exemplary embodiments disclosed herein are not intended to be limiting, and the true scope and spirit of which is indicated by the appended claims.

What is claimed is:

1. A substrate processing apparatus comprising:
   a holder configured to hold a substrate having a pattern formed with a resist material for ArF immersion lithography on a surface of the substrate inside a processing container;
   a rotation driver configured to rotate the holder around a vertical axis; and
   a light source part having a plurality of light sources configured to irradiate the surface of the substrate held by the holder which is rotated around the vertical axis by the rotation driver wherein the light sources include irradiating vacuum ultraviolet light,
   wherein an amount of irradiation of an inner side in a radial direction around the vertical axis of the substrate with light from the light source part is made larger than an amount of irradiation of an outer side in the radial direction of the substrate with light from the light source part, and
   wherein the light emitted from the plurality of light sources forms a continuous spectrum that includes light having a wavelength longer than 160 nm and light having a wavelength shorter than 160 nm, in a range of 10 nm to 200 nm.

2. The substrate processing apparatus of claim 1, wherein an output intensity of an inner light source of the plurality of light sources, which irradiates the inner side of the substrate with light, is made higher than an output intensity of an outer light source of the plurality of light sources, which irradiates the outer side of the substrate with light.

3. The substrate processing apparatus of claim 1, wherein a time of irradiation of the inner side of the substrate with light is different from a time of irradiation of the outer side of the substrate with light.

4. The substrate processing apparatus of claim 1, further comprising;
   a gas supply part configured to supply an inert gas into the processing container; and
   a gas discharge part configured to discharge a gas from the processing container,
   wherein the gas supply part supplies the gas and the gas discharge part discharges the gas, while changing an internal pressure of the processing container during the irradiation with light by the light, source part.

5. A substrate processing method of irradiating a surface of a substrate having a pattern formed with a resist material for ArF immersion lithography on the surface of the substrate inside a processing container with light including vacuum ultraviolet light from a light source part having a plurality of light sources while rotating the substrate around a vertical axis, the method comprising:
   making an amount of irradiation of an inner side in a radial direction around the vertical axis of the substrate with light from the light source part larger than an amount of irradiation of an outer side in the radial direction of the substrate with light from the light source part,
   wherein the light emitted from the plurality of light sources forms a continuous spectrum that includes light having a wavelength longer than 160 am and light having a wavelength shorter than 160 nm, in a range of 10 nm to 200 nm.

6. A non-transitory computer-readable storage medium storing a program that causes an apparatus to perform the substrate processing method of claim 5.

7. The substrate processing apparatus of claim 1, wherein the plurality of light sources are arranged along a plurality of concentric circles centered at the vertical axis in a plan view, and
   the light sources arranged along any one of the plurality of concentric circles are arranged to be spaced apart from each other in a circumferential direction around the vertical axis.

8. The substrate processing method of claim 5, wherein the light is emitted from the plurality of light sources which are arranged along a plurality of concentric circles centered at the vertical axis in a plan view, and
   light sources arranged along any one of the plurality of concentric circles are arranged to be spaced apart from each other in a circumferential direction around the vertical axis.

9. The substrate processing method of claim 5, wherein the irradiation of the substrate with the light from the light source part is performed when an internal pressure of the processing container is lower than air atmosphere, and
   the internal pressure of the processing container is gradually decreased during the irradiation of the substrate with the light from the light source part.

* * * * *

UNITED STATES PATENT AND TRADEMARK OFFICE
CERTIFICATE OF CORRECTION

| | |
|---|---|
| PATENT NO. | : 11,402,758 B2 |
| APPLICATION NO. | : 17/008847 |
| DATED | : August 2, 2022 |
| INVENTOR(S) | : Keiichi Tanaka |

It is certified that error appears in the above-identified patent and that said Letters Patent is hereby corrected as shown below:

In the Claims

Claim 5, Column 22, Line 3, please delete the phrase "longer than 160 am and" and replace with "longer than 160 nm and".

Signed and Sealed this
Twenty-eighth Day of March, 2023

Katherine Kelly Vidal
*Director of the United States Patent and Trademark Office*